US 9,834,850 B1

United States Patent
McGeehin et al.

(10) Patent No.: US 9,834,850 B1
(45) Date of Patent: Dec. 5, 2017

(54) METHOD OF FORMING ONE OR MORE METAL AND/OR METAL ALLOY LAYERS IN PROCESSES FOR MAKING TRANSDUCERS IN SLIDERS, AND RELATED SLIDERS

(71) Applicant: Seagate Technology LLC, Cupertino, CA (US)

(72) Inventors: Peter Kevin McGeehin, Letterkenny (IE); Mark Anthony Gubbins, Letterkenny (IE); Marcus Benedict Mooney, Quigley's Point (IE)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 15/231,272

(22) Filed: Aug. 8, 2016

(51) Int. Cl.
*G11B 5/60* (2006.01)
*C25D 7/12* (2006.01)
*C25D 5/02* (2006.01)

(52) U.S. Cl.
CPC ............ *C25D 7/123* (2013.01); *C25D 5/022* (2013.01); *G11B 5/6082* (2013.01)

(58) Field of Classification Search
CPC ................................ G11B 5/60; G11B 5/6082
USPC ........................................................ 360/236.5
See application file for complete search history.

(56) References Cited

U.S. PATENT DOCUMENTS

| 4,624,754 A | 11/1986 | McManis, III et al. |
| 6,600,636 B1 | 7/2003 | Liikanen et al. |
| 7,897,472 B2 * | 3/2011 | Hopper ............... H01L 23/5227 257/531 |
| 8,322,023 B1 | 12/2012 | Zeng et al. |
| 8,518,298 B2 | 8/2013 | Abbott |
| 8,630,057 B2 | 1/2014 | Murthy et al. |
| 8,742,047 B2 | 6/2014 | Lewandowski et al. |
| 9,017,541 B2 | 4/2015 | Seddon et al. |
| 2008/0081398 A1 * | 4/2008 | Lee ..................... B81C 1/00301 438/109 |
| 2009/0242414 A1 | 10/2009 | Welz-Biermann et al. |

FOREIGN PATENT DOCUMENTS

| GB | 2470590 A | 12/2010 |
| WO | 2010/136814 A2 | 12/2010 |
| WO | 2011/149330 A1 | 12/2011 |

OTHER PUBLICATIONS

Ispas et al., "Electrodeposition in Ionic Liquids", The Electrochemical Society Interface, vol. 23, No. 1, Spring 2014 (pp. 47-51).
Cooper et al., "Recent developments in high-moment electroplated materials for recording heads", IBM J. Res. & Dev., vol. 49, No. 1, Jan. 2005 (pp. 103-126).

* cited by examiner

*Primary Examiner* — Allen T Cao
(74) *Attorney, Agent, or Firm* — Kagan Binder, PLLC (57) ABSTRACT

Disclosed herein are methods of forming one or more transducer elements in a transducer region of a slider by electrodepositing one or more metal ions from an ionic liquid solvent, and related sliders.

12 Claims, 5 Drawing Sheets

METHOD OF FORMING ONE OR MORE METAL AND/OR METAL ALLOY LAYERS IN PROCESSES FOR MAKING TRANSDUCERS IN SLIDERS, AND RELATED SLIDERS

FIELD

The present disclosure relates to computer hard disk drive transducer heads, and related methods of making. In particular, the present invention relates to transducer heads having a write head and/or read head formed at least in part via electrodeposition of a metal or metal alloy from an ionic liquid.

BACKGROUND

Computer hard disk drives can store information on magnetic disks. The information can be stored on each disk in concentric tracks, divided into sectors. The information can be written to and read from a disk by a transducer head, mounted on an actuator arm capable of moving the transducer head radially over the disk. Accordingly, the movement of the actuator arm allows the transducer head to access different tracks. The disk can be rotated by a spindle motor at a high speed, allowing the transducer head to access different sectors on the disk.

There is a continuing desire for new and/or improved transducer heads, and related methods of making such heads.

SUMMARY

In some embodiments of the present disclosure is a method of plating a metal or metal alloy onto a wafer to form one or more transducer elements, wherein the method comprises:

a) providing a wafer comprising two or more layers of material, wherein at least one of the layers comprises a patterned layer for forming one or more transducer elements in the wafer, wherein the pattern comprises one or more cavities in a major surface of the patterned layer;

b) electrodepositing one or more metals from a non-aqueous composition into at least a portion of the one or more cavities to fill at least the one or more cavities thereby defining at least a portion of the one or more transducer elements, wherein the non-aqueous composition comprises an ionic liquid solvent and one or more metal salts dissolved in the ionic liquid solvent, wherein the ionic liquid solvent comprises a cation and anion.

In other embodiments of the present disclosure is a slider body comprising:
a first side face;
a second side face;
an air bearing face, wherein the air bearing face comprises a leading edge and a trailing edge, wherein the air bearing face; comprising a transducer region comprising one or more transducer elements, wherein at least one of the transducer elements comprises a metal alloy comprising at least one of titanium or tantalum; and
a trailing edge face that is adjacent to the trailing edge of the air bearing face.

DETAILED DESCRIPTION

The present disclosure is in the context of plating a metal or metal alloy from an ionic liquid onto a wafer to form one or more transducer elements, and related sliders.

Figure 1:
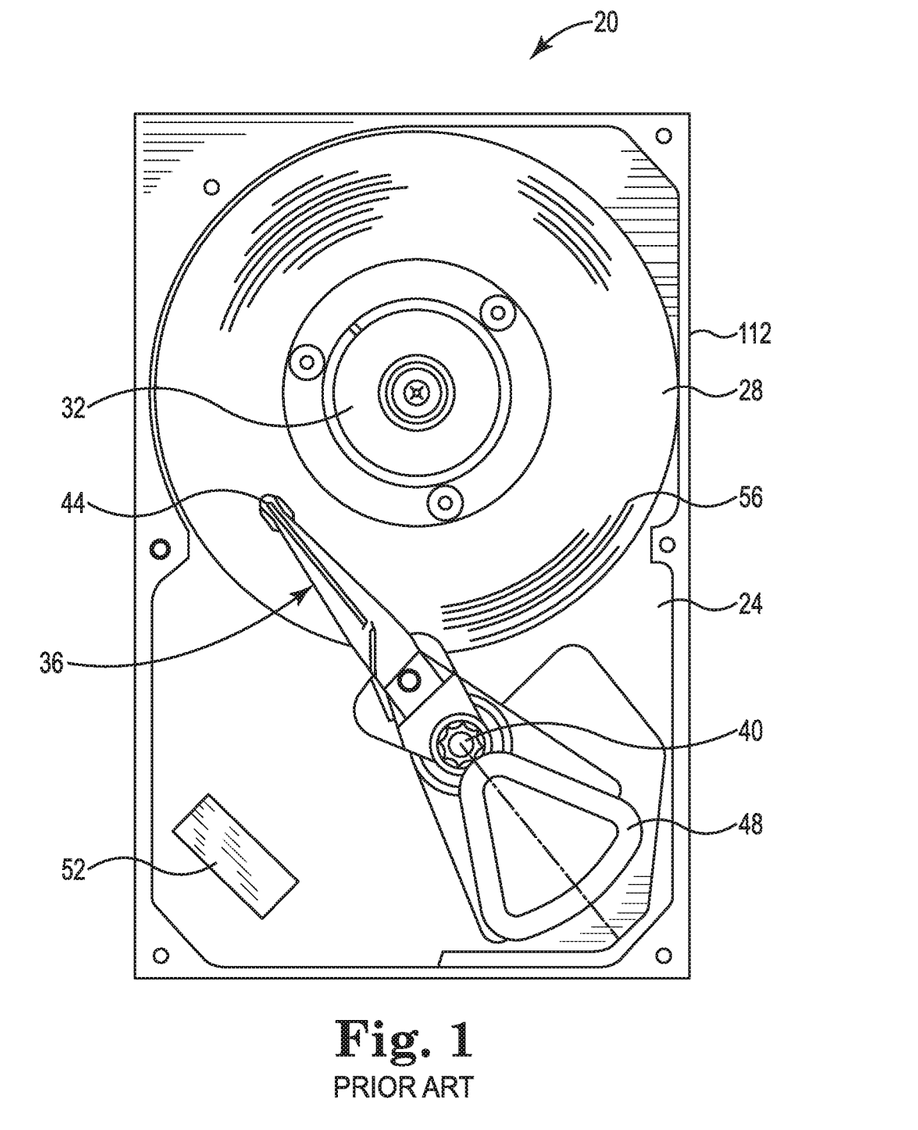
FIG. 1 is a top view of a portion of a prior art computer disk drive, with the cover removed.

An example of a computer disk drive is illustrated in FIG. 1. The disk drive 20 includes a base 24 and one or more magnetic disks 28 (only one of which is shown in FIG. 1). As shown, the magnetic disks 28 are interconnected to the base 24 by a spindle motor (not shown) mounted within or beneath the hub 32, such that the disks 28 can be rotated relative to the base 24. As shown, actuator arm assemblies 36 (only one of which is shown in FIG. 1) are interconnected to the base 24 by bearings 40, such that they can be moved radially with respect to the magnetic disks 28. The actuator arm assemblies 36 include sliders (or slider bodies) 44 (only one of which is illustrated in FIG. 1) at a first end, to address each of the surfaces of the magnetic disks 28. A slider body includes transducer elements. A slider body 44 includes a first side face; a second side face; an air bearing face; and a trailing edge face. The air bearing face includes a leading edge, a trailing edge, and a transducer region including one or more transducer elements. The trailing edge face is adjacent to the trailing edge of the air bearing face.

Exemplary transducer elements that can be formed using ionic liquid solvent plating techniques described herein include one or more of a write pole, a writer shield, a reader shield, combinations of these, and the like.

As shown in FIG. 1, a voice coil motor 48 can pivot the actuator arm assemblies 36 about the bearings 40, to radially position a slider 44 across the surfaces of the magnetic disks 28. The voice coil motor 48 can be operated by a controller 52 that is in turn operatively connected to a host computer (not shown). By changing the radial position of a slider body 44 with respect to the magnetic disks 28, the transducer elements in a slider body 44 can access different data tracks or cylinders 56 on the magnetic disks 28.

Figure 2:
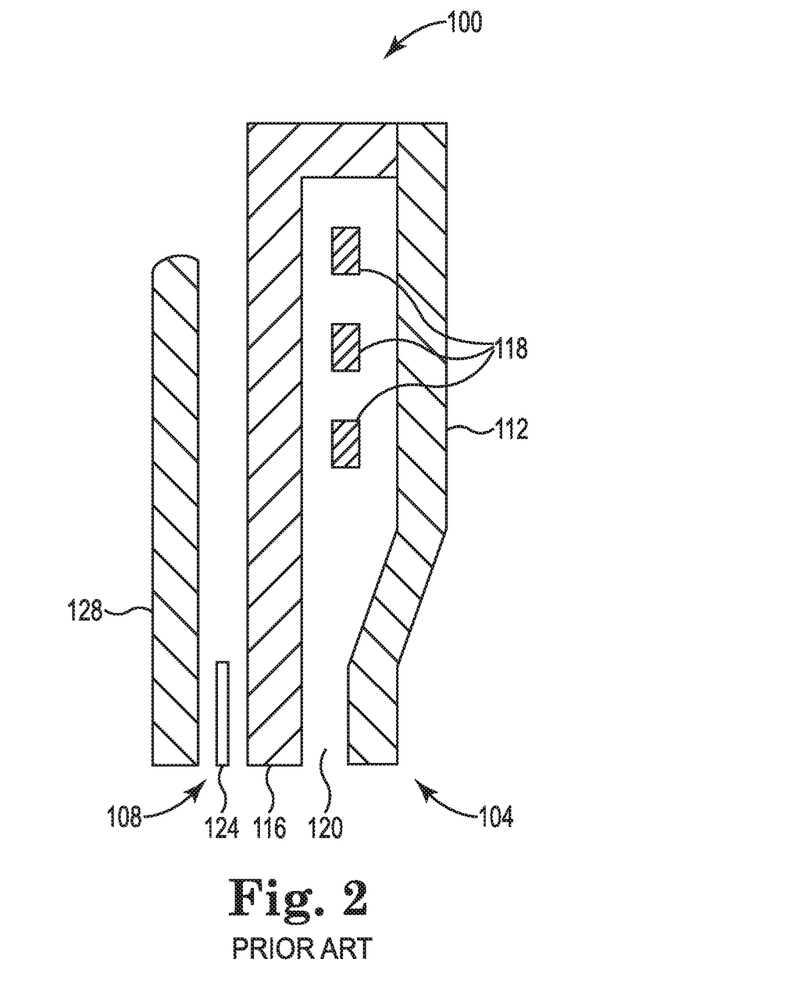
FIG. 2 is a cross-sectional view of a prior art transducer head.

An example of a transducer region 100 is illustrated in FIG. 2, and includes a write head 104 and a read head 108. The write head 104 is known as an inductive head. Where such heads are constructed from ferrite material, they are known as ferrite heads. As shown, write head 104 includes a yoke of magnetically conductive material formed from a write pole 112 and a shared shield 116. As shown, a coil of electrically conductive wire 118 is wrapped about a portion of the yoke, and the ends of that coil are connected to a current source (not shown). During a write operation, current is introduced to the coil in a first direction. The electrical current through the coil produces a magnetic field within the yoke. At a gap 120 formed between an end of the write pole 112 and an end of the shared shield 116, the magnetic field spreads out because the magnetic permeability of the gap is less than that of the yoke itself. The gap 120 is positioned so that it is in close proximity to the magnetic disk, allowing some of the magnetic field to pass through the disk and magnetize a portion of the disk in a particular direction. In some embodiments, a disk drive for use in a digital computer, a "one" can be coded by reversing the direction in which the disk is magnetized from one portion of a track to the next. This can be done by reversing the direction of the current in the coil. A zero can be indicated by the absence of a change in magnetic polarity. Of course, this protocol could be reversed.

The read head 108 in a disk drive can operate by sensing the magnetic flux transitions encoded in the disk by the write operation. One method of sensing such transitions is with a magnetoresistive head. Such a head can be made of material that changes its electrical resistance when it is exposed to a magnetic field. Magnetoresistive heads have come into wide use in disk drive systems because they are capable of providing high signal output. High signal output can be desirable, because the magnetic fields produced in the disks by the write operation can be relatively very small. In addition, the high signal output of the magnetoresistive head can allow the data on the disk to be densely packed, allowing the disk drive to have a high storage capacity.

Magnetoresistive read heads can include a strip of magnetoresistive material 124 held between two magnetic shields. As shown in FIG. 2, the magnetic shields are formed from the shared shield 116 and a read shield 128. Each end of the strip of magnetoresistive material 124 is connected to a conductor (not shown). The conductors are in turn can be connected to a current source (not shown). Because the electrical resistance of the magnetoresistive material can vary with the strength and direction of an applied magnetic field, magnetic flux transitions result in changes in the voltage drop across the magnetoresistive strip. These changes in the voltage drop are sensed and then converted into a digital signal for use by the host computer.

In order to sense the transitions between the small magnetic fields and thus retrieve data from the magnetic disk, the magnetoresistive read head 108 can be held in close proximity to the track containing the desired information. The disk 28 can be rotated under the head 44, and flux transitions read by the head 44 can be interpreted as a binary "one", as described above. The magnetic shields on either side of the magnetoresistive material 124 can limit the effect of magnetic flux transitions adjacent to or in the proximity of the precise area of the track from which information is to be retrieved. In some embodiments, one pole of the inductive write head also serves as part of the shield. In some embodiments, this shared shield can be about 1-3 µm thick.

Embodiments of the present disclosure are related to forming one or more transducer elements in a slider. In particular, embodiments of the present disclosure are directed to a method of plating a metal or metal alloy onto a wafer to form one or more transducer elements by electrodepositing one or more metals from an ionic liquid. Exemplary embodiments of the present disclosure are illustrated as process 300 in FIG. 3, process 400 in FIG. 4, and process 500 in FIG. 5, which figures are described throughout herein below.

Figure 3:
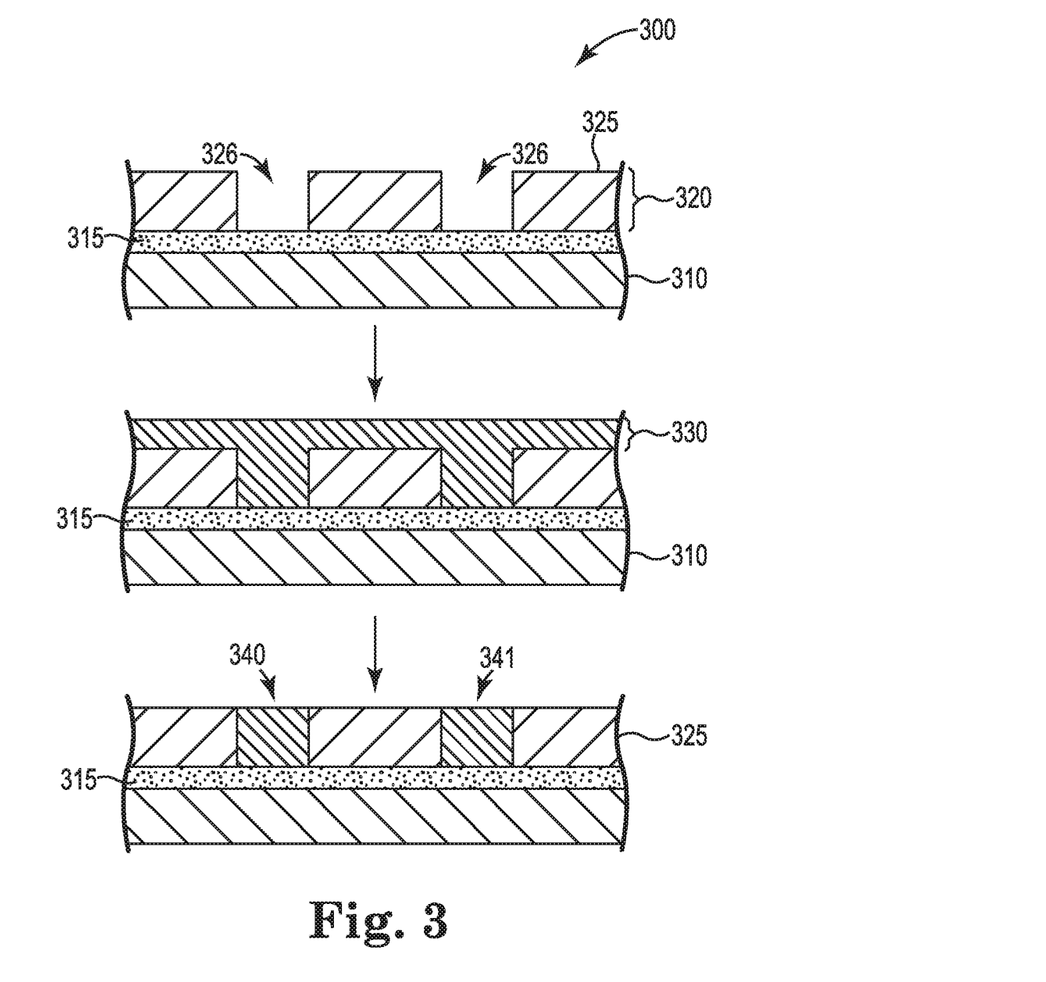
FIG. 3 is one embodiment of a flow diagram showing multiple cross-sectional views of forming plating a metal or metal alloy onto a wafer.
Figure 4:
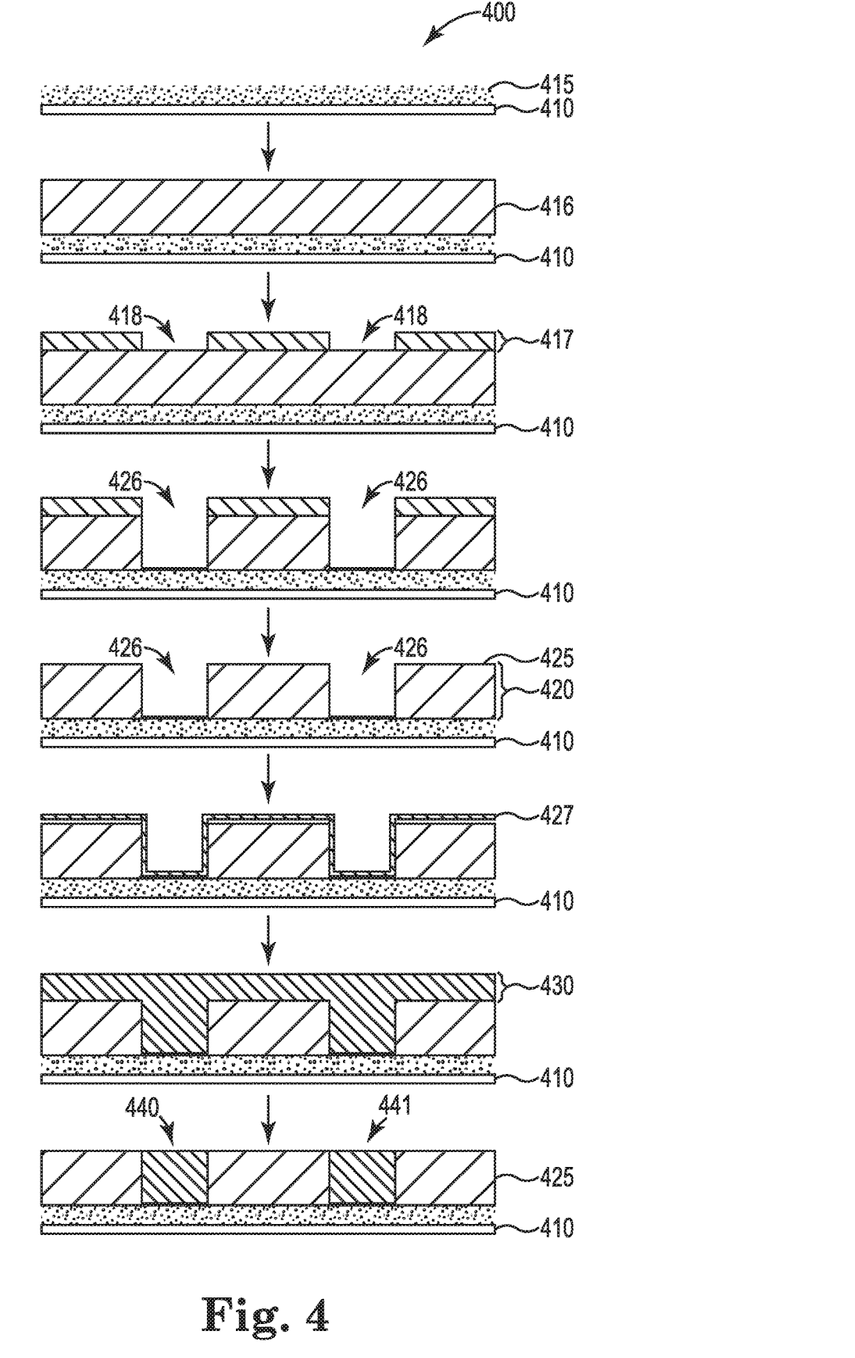
FIG. 4 is another embodiment of a flow diagram showing multiple cross-sectional views of forming plating a metal or metal alloy onto a wafer.
Figure 5:
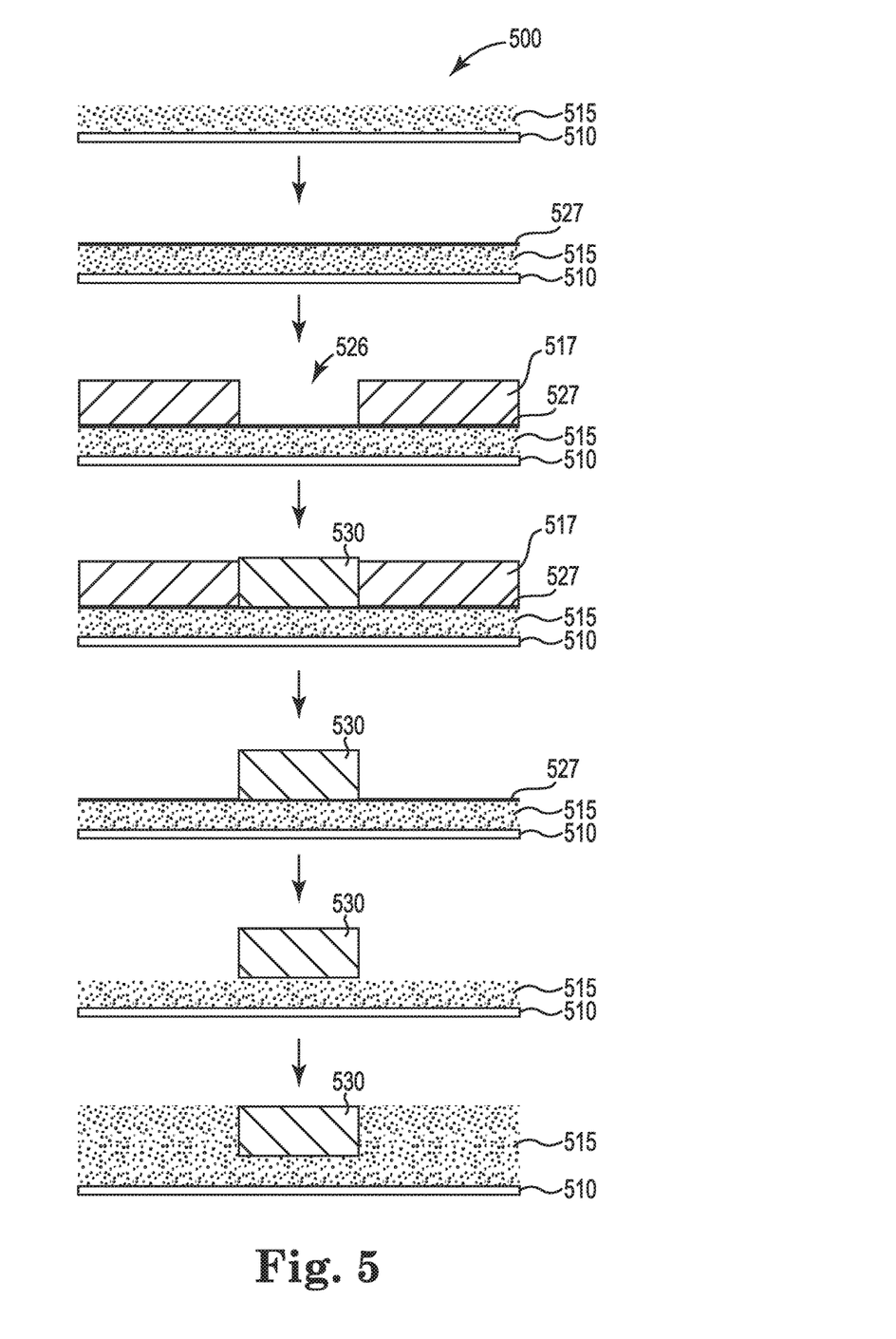
FIG. 5 is another embodiment of a flow diagram showing multiple cross-sectional views of forming plating a metal or metal alloy onto a wafer.

Methods of the present disclosure include providing a wafer for forming one or more transducer elements thereon. In some embodiments, a wafer includes two includes two or more layers of material. Examples of a wafer are illustrated in FIGS. 3-5. As shown in FIG. 3, the wafer includes a layer 310 and a layer 320. As shown in FIG. 4, the wafer includes a layer 410 and layer 420. As shown in FIG. 5, the wafer includes a layer 510 and layer 515. One or more layers of a wafer can be made out of a variety of materials. In some embodiments, layer 310, layer 410, and layer 510 can be made out of a two phase mixture of alumina and titanium-carbide (AlTiC). Layers 310, 410, and 510 can have a range of thicknesses, e.g., from 0.1 to 5 mm, from 0.5 to 3 mm, or even from 1 to 2 mm.

As used herein, a "wafer" can be processed to form a plurality of sliders (read/write heads). After processing a wafer as described herein, the wafer can be subsequently processed (e.g., slicing and dicing operations) to divide the wafer into individual sliders.

At least one of the layers of the wafer includes a pattern (i.e., "a patterned layer") to form one or more transducer elements in the wafer. As shown in FIG. 3, layer 320 includes a pattern defined by cavities 326 in the major surface 325, thereby forming a patterned layer 320. As shown in FIG. 4, layer 420 includes a pattern defined by cavities 426 in the major surface 425, thereby forming a patterned layer 420. The remainder of process 500 in FIG. 5 is further discussed below.

A patterned layer can be formed by a variety of techniques. In some embodiments, a patterned layer can be formed using photolithography. An example of such a method is illustrated with respect to FIG. 4. In FIG. 4, a layer 416 is formed over layer 410. Such a layer can be formed into what is referred to as a "hard mask" 420. A layer 416 can be made out of a variety of materials, e.g., one or more dielectric materials. Specific exemplary materials include alumina or silicon dioxide.

Optionally, as shown in FIG. 3, basecoat layer 315 (e.g., alumina) can be included over layer 310. Similarly, as shown in FIG. 4, basecoat layer 415 can be included between layer 410 and layer 416. In some embodiments, the basecoat layer 410 can be made of the same material as the layer 416. For example, both layer 415 and layer 416 can be made out of alumina.

Next, a pattern 417 can be formed over the layer 416. The pattern 417 includes openings 418 that expose a surface of the underling layer 416. The pattern 417 can be formed using photolithography and can be made out of a metal material so as to stand up to ion milling. After forming pattern 417, the exposed surfaces of the layer 416 can be etched through the layer 416 to form patterned layer 420 (also referred to a "damascene mask"). After the layer 416 has been etched, the material 417 can be removed. The material 417 can be removed at one or more points in the process shown in FIG. 4. For example, as shown in FIG. 4, material 417 can be removed directly after forming cavities 426 via reactive ion etching ("rie"). Alternatively (not shown in FIG. 4), the material 417 can be removed in the last step (discussed below) when a portion of the layer 430 that overlies the major surface 425 of the patterned layer 420 is removed to define at least a portion transducer elements 440 and 441.

Optionally, an electrically conductive layer can be provided over the patterned layer so that the electrically conductive layer conforms to topography of the patterned layer to facilitate plating a metal or metal alloy. Although not shown in FIG. 3, an electrically conductive layer can be present on at least the bottom surface of cavities 326. An embodiment where an electrically conductive layer is present on only the bottom of a cavity is illustrated in FIG. 5, which is discussed below. Optionally, the side walls of cavities 326 can also include an electrically conductive layer. For example, as shown in FIG. 4, an electrically conductive layer 427 can be provided over the patterned layer 420 so that the electrically conductive layer conforms to topography of the patterned layer 420.

In some embodiments, the electrically conductive layer 427 has a thickness in the range from 100 angstroms to 3000 angstroms, or even from 200 to 1000 angstroms. In some embodiments, the electrically conductive layer 427 can be made out of the same material as a transducer element.

Next, one or more one or more metals can be electrodeposited from a non-aqueous composition onto at least a portion of a patterned layer to form a layer of metal (e.g., elemental metal) or metal alloy adjacent to the major surface of the patterned layer. The non-aqueous composition includes an ionic liquid solvent and one or more metal salts dissolved in the ionic liquid solvent. A non-aqueous composition refers to a composition that is not aqueous-based like aqueous compositions used in many known electrodeposition techniques. The non-aqueous composition is based on an ionic liquid as a solvent or electrolyte in which to electrodeposit one or more metals therefrom.

As used herein, "ionic liquid solvent" means a liquid that is capable of being produced by melting a solid at or below 100° C. An ionic liquid solvent can consist solely of ions (e.g., at least one cation and at least one anion). Ionic liquids may be derived from inorganic and/or organic salts. Accordingly, an ionic liquid cation can include an organic cation (e.g., pyrrolidinium, imidazolium, ammonium) and/or an inorganic cation, and an ionic liquid anion can include an organic anion and/or an inorganic anion (e.g., chloride, bromide, triflate, tetrafluoroborate). Ionic liquid solvents are different from aqueous solvents, organic solvents, and high temperature molten salts.

In some embodiments, an ionic liquid solvent includes a halometallate ionic liquid solvent. Halometallate ionic liquid solvents refer to a class of ionic liquid solvents that include an organic halide, usually with an organic cation such as imidazolium or pyridinium, and a Lewis acid metal halide. For example, an organic chloride and $AlCl_3$ can be combined to form a chloroaluminate ionic liquid solvent. In halometallate ionic liquid solvents, a Lewis acid can tend to associate with an anion of the ionic liquid to form a Lewis acid anion. In some embodiments, a higher molar ratio of Lewis acid to organic halide can give a Lewis acidic system, and a lower molar ratio of Lewis acid to organic halide can give a Lewis basic system.

In some embodiments, an ionic liquid solvent can include a deep eutectic solvent, which is a eutectic mixture of a quaternary ammonium halide, and an inorganic metal salt or an organic hydrogen-bound donor (e.g., an amide or an alcohol). An exemplary deep eutectic solvent includes a mixture of choline halide (e.g., chloride) and urea.

Salts and oxides of one or more metals can be dissolved in an ionic liquid. In some embodiments, for example when using a halometallate ionic liquid, variations in Lewis acidity can change the electrochemical properties of the system. This feature can facilitate the proportions of co-deposited metals to be controlled.

As mentioned, in some embodiments, one or more metal salts can be dissolved in an ionic liquid. Exemplary metal salts include a metal halide, a metal sulfate, and mixtures thereof. In some embodiments, a metal salt can include a nickel salt, an iron salt, a cobalt salt, a tantalum salt, a titanium salt, a magnesium salt, a palladium salt, an indium salt, a gallium salt, an antimony salt, a tellurium salt, a cadmium salt, a copper salt, a zinc salt, a tin salt, a germanium salt, a silicon salt, an aluminum salt, a noble metal salt, and mixtures thereof.

Optionally, one or more additives can be included in the ionic liquid solvent to facilitate plating and/or the properties of the plated material (e.g., morphology, mechanical properties, and/or electrochemical properties). Exemplary optional additives include one or more of acetonitrile, coumarin, thiourea, benzotriazole, and acetone.

Either an elemental metal can be electrodeposited from an ionic liquid or a metal alloy can be electrodeposited from an ionic liquid by simultaneously electrodepositing two or more different metals from an ionic liquid. Accordingly, a deposited metal or metal alloy (and corresponding transducer element) could include one or more of the corresponding metals from the corresponding salt such as nickel, iron, cobalt, tantalum, titanium, aluminum, and a noble metal (e.g., gold, silver, or platinum).

While not being bound by theory, it is believed that metals and/or metal alloys electrodeposited from an ionic liquid may have one or more better mechanical/physical properties as compared to the same metal or metal alloy deposited from an aqueous solution. For example, due to the presence of hydrogen ions in solution during aqueous electrodeposition, competing reactions can occur at the cathode as well as metal ion reduction. Hydrogen reduction is a competing reaction and can result in hydrogen embrittlement (hydrogen trapped in the deposit). Hydrogen embrittlement can cause a brittle deposit. Stresses can be unduly high in deposits where hydrogen has been trapped. Also, current efficiency can drop when other species other than the target metal ion or metal ions are reduced at the cathode surface. Further, plating rate can drop with a reduction in current efficiency, thereby causing wafer cycle times to go up with corresponding longer plating times. Accordingly, it is believed that metals and/or metal alloys electrodeposited from an ionic liquid can avoid such issues involved with aqueous solutions.

Also, while not being bound by theory, it is believed that metals and/or metal alloys (e.g., NiFe, CoNiFe and CoFe) formed from an ionic liquid as opposed to using aqueous chemistry can have one or more improved physical and magnetic properties such as lower coercivity (softness), lower stress, reduced grain size, less impurities, lower porosity, increased corrosion resistance (e.g., no sulphur inclusions from plating bath additives) and lower cycle time.

While not being bound by theory, it is believed that metals that may be difficult or practically impossible to electrodeposit from aqueous solutions can be electrodeposited from an ionic liquid. Some metals can be challenging to electrodeposit from aqueous chemistry because the Nernst potential of such metals is below that at which water decomposes. Accordingly, metals such as tantalum (Ta), magnesium (Mg), titanium (Ti), and/or aluminum (Al) could be plated via an ionic liquid solvent according to the present disclosure with one or more other metals to enhance one or more properties such as corrosion resistance. As another example, a noble metal such as gold (Au) may be able to be deposited with a magnetic metal like iron (Fe) to form an alloy.

A non-aqueous composition can be formed by mixing an ionic liquid solvent and one or more metal salts. A salt can be provided in an ionic liquid solvent in a concentration so as to provide the desired amount of metal on a substrate after plating. By using an ionic liquid solvent, it is believed that the amount of metal in the ionic liquid solvent can be relatively close to the amount of metal plated onto a substrate, especially as compared to using aqueous chemistry. In some embodiments, the concentration of a metal salt in an ionic liquid solvent can be in the range from 0.001 to 10 M, from 0.005 to 5M, or even from 0.05 to 3M. Also, by using an ionic liquid solvent, it is believed that the amount of two or more metals in the ionic liquid can be relatively close to the amount of the two or more metals plated onto a substrate, especially as compared to using aqueous chemistry. For example, the presence of some metals can reduce the amount of another metal that is plated out of solution in aqueous chemistry so the amount of the other metal in the aqueous solution is often increased to achieve the desired amount plated onto a substrate. Using an ionic liquid solvent may facilitate plating the out relatively more of the other metal. In some embodiments, the weight ratio of the concentration of one metal salt to a second metal salt in an ionic liquid solvent can be in the range from 0.3 to 0.7, or even from 0.4 to 0.6.

A variety of electrodeposition techniques can be used to plate a metal or metal alloy (electrocodeposition) from an ionic liquid solvent. Different techniques can use different sources for providing electrons to reduce metal ions present in an ionic liquid solvent. One example is to provide a power source as a source of reducing electrons. A source of electrons can be constant or dynamic. For example, galvanostatic plating (DC plating) can utilize a constant current density as a source of reducing electrons. DC plating can advantageously to help provide a metal coating with uniform composition. Another example of a power source as a source of reducing electrons includes potentiostatic constant voltage plating. Another example of a power source as a source of reducing electrons includes galvanodynamic plating, which pulses a current as desired. Galvanodynamic plating can advantageously facilitate controlling grain size. Yet another example of a power source as a source of reducing electrons includes potentiodynamic voltage plating, which switches the voltage from on to off as desired.

Elecrodepositing elemental zirconium from an ionic liquid is disclosed in U.S. Pat. No. 9,017,541 (Seddon et al.), the entirety of which patent is incorporated herein by reference.

Electrodeposition can occur when the non-aqueous composition is at a temperature in the range from 0° C. to less than 100° C., from 15° C. to 50° C., or even from 20° C. to 35° C.

Electrodeposition can occur for a time period in the range from 30 seconds to one hour, from 5 minutes to 30 minutes, or even from 10 minutes to 20 minutes.

Electrodeposition can include a working electrode (e.g., a wafer having a patterned layer) and a counter electrode. The counter electrode may be made from a metal (e.g., platinum), a semiconductor or glassy carbon. In some embodiments, a third electrode (e.g., silver) can be included as a reference electrode.

Referring to FIG. 3, one or more metals are electrodeposited from a non-aqueous composition onto at least a portion of the patterned layer 320 to form a layer 330 of metal or metal alloy adjacent to the major surface 325 of the patterned layer 320. As shown, the metal or metal alloy of layer 330 fills one or more cavities 326 in the major surface of the patterned layer 320. Similarly, referring to FIG. 4, one or more metals are electrodeposited from a non-aqueous composition onto at least a portion of the patterned layer 420 to form a layer 430 of metal or metal alloy adjacent to the major surface 425 of the patterned layer 420. As shown, the metal or metal alloy of layer 430 fills one or more cavities 426 in the major surface of the patterned layer 420. Although not shown, in some embodiments, the portion of layer 430 overlying approximately the centers of cavities 426 can be relatively depressed so as to form a "pothole" like topography on the three-dimensional surface of layer 430. While not being bound by theory, it is believed that during plating the sidewalls of cavities having conductive material thereon such as in FIG. 4 can contribute to the formation of such pothole like topography. In some embodiments, to help reduce such plating consequences a polymer (e.g., a glycol-based polymer) coating can be applied to the cavity sidewalls so as to hinder plating on the sidewalls so that plating from the bottom of the cavity dominates the filling of a cavity.

Next, at least a portion of the layer of metal or metal alloy that overlies the major surface of the patterned layer can be removed such that the metal alloy remains in the one or more of the cavities to define at least a portion of the one or more transducer elements. For example, as shown in FIG. 3, a portion of the layer 330 that overlies the major surface 325 of the patterned layer 320 can be removed such that the metal or metal alloy remains in the one or more of the cavities 326 to define at least a portion of transducer elements 340 and 341. As shown in FIG. 4, a portion of the layer 430 that overlies the major surface 425 of the patterned layer 420 can be removed such that the metal or metal alloy remains in the one or more of the cavities 426 to define at least a portion of transducer elements 440 and 441.

Transducer elements 340, 341, 440, and 441 generically represent at least a portion of an exemplary transducer element such as a write pole, a writer shield, a reader shield, combinations of these, and the like.

Next, the remainder of process 500 in FIG. 5 is discussed. Instead of forming cavities (vias) in a layer such as 420 and then plating a metal or metal alloy in such cavities 426, cavities can be formed using photoresist material as shown in FIG. 5. As shown in FIG. 5, an electrically conductive layer 527 can be provided over basecoat 515. As described below, 515 can be built up around a transducer element 530 after forming the transducer element. Basecoat 515 can be made out of a variety of materials, e.g., one or more dielectric materials. Specific exemplary materials include alumina or silicon dioxide. As also shown in FIG. 5, a photoresist layer 517 is formed on electrically conductive layer 527 so as to form a pattern of cavities such as cavity 526. By forming photoresist layer on electrically conductive layer 527, only the bottom of cavity 526 has electrically conductive layer 527 to facilitate plating a metal or metal alloy. Such a strategy can avoid forming the pothole topography as described above with respect to FIG. 4.

Accordingly, as shown in FIG. 5, one or more metals are electrodeposited from a non-aqueous composition into the cavities 526 of the patterned layer 517 to form transducer elements 530. After forming transducer elements 530, the photoresist material 517 can be stripped away down to basecoat 515, followed by additional basecoat material so as to form a layer 515 that is approximately level with the top surface of transducer element 530.

Transducer elements 530 generically represent at least a portion of an exemplary transducer element such as a write pole, a writer shield, a reader shield, combinations of these, and the like.

What is claimed is:

1. A method of plating a metal or metal alloy onto a wafer to form one or more transducer elements, wherein the method comprises:
   a) providing a wafer comprising two or more layers of material, wherein at least one of the layers comprises a patterned layer for forming one or more transducer elements in the wafer, wherein the pattern comprises one or more cavities in a major surface of the patterned layer;
   b) electrodepositing one or more metals from a non-aqueous composition into at least a portion of the one or more cavities to fill at least the one or more cavities thereby defining at least a portion of the one or more transducer elements, wherein the non-aqueous composition comprises an ionic liquid solvent and one or more metal salts dissolved in the ionic liquid solvent, wherein the ionic liquid solvent comprises a cation and anion.

2. The method of claim 1, wherein the ionic liquid solvent has a melting point of 100° C. or less.

3. The method of claim 1, wherein the ionic liquid cation comprises an organic cation or inorganic cation, and the ionic liquid anion comprises an organic anion or an inorganic anion.

4. The method of claim 1, wherein the ionic liquid solvent comprises a halometallate ionic liquid.

5. The method of claim 1, wherein the two or more metal salts are chosen from a nickel salt, an iron salt, a cobalt salt, a tantalum salt, a titanium salt, an aluminum salt, a noble metal salt, and mixtures thereof.

6. The method of claim 1, wherein the two or more metal salts are chosen from a metal halide, a metal sulfate, and mixtures thereof.

7. The method of claim 1, wherein at least a portion of an interior portion of the one or more cavities comprise an electrically conductive material having a thickness in the range from 100 angstroms to 3000 angstroms.

8. The method of claim 1, further comprising providing an electrically conductive layer, wherein the patterned layer is made out of photoresist material, and wherein the photoresist layer is formed over and in contact with the electrically conductive layer.

9. The method of claim 1, wherein electrodepositing comprises electrodepositing one or more metals from a non-aqueous composition onto at least a portion of the patterned layer to form a layer of metal or metal alloy adjacent to the major surface of the patterned layer, and wherein the metal or metal alloy fills at least the one or more cavities in the major surface of the patterned layer; and further comprising removing at least a portion of the layer of metal or metal alloy that overlies the major surface of the patterned layer such that the metal or metal alloy remains in the one or more of the cavities.

10. The method of claim 9, wherein providing the wafer comprises:
  a) providing a substrate comprising a two phase mixture of alumina and titanium-carbide, wherein the substrate has a first major surface;
  b) providing a layer over the substrate, wherein the layer comprises alumina or silicon dioxide;
  c) providing a material comprising metal over the layer to form a pattern over the layer, wherein the pattern includes openings that expose a surface of the underling layer; and
  d) etching the exposed surfaces of the layer through the layer to form the patterned layer; and
  e) removing the material; and
  f) providing an electrically conductive layer over the patterned layer.

11. The method of claim 10, further comprising a basecoat layer between the wafer and the layer, wherein the basecoat layer comprises alumina.

12. The method of claim 1, further comprising, prior to electrodepositing, providing an electrically conductive layer over the patterned layer so that the electrically conductive layer conforms to topography of the patterned layer, wherein the electrically conductive layer has a thickness in the range from 100 angstroms to 3000 angstroms.

* * * * *